(12) United States Patent
Adam et al.

(10) Patent No.: US 8,080,451 B2
(45) Date of Patent: Dec. 20, 2011

(54) FABRICATING SEMICONDUCTOR STRUCTURES

(75) Inventors: Thomas N. Adam, Poughkeepsie, NY (US); Ashima B. Chakravarti, Hopewell Junction, NY (US); Eric C. T. Harley, LaGrangeville, NY (US); Judson R. Holt, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 12/684,551

(22) Filed: Jan. 8, 2010

(65) Prior Publication Data
US 2010/0112762 A1 May 6, 2010

Related U.S. Application Data

(62) Division of application No. 11/970,592, filed on Jan. 8, 2008, now Pat. No. 7,687,804.

(51) Int. Cl.
*H01L 21/00* (2006.01)
*H01L 21/84* (2006.01)

(52) U.S. Cl. ............ 438/149; 438/30; 438/479; 257/52; 257/59

(58) Field of Classification Search ............. 438/30, 438/48, 149, 269, 479; 257/52, 57, 59
See application file for complete search history.

(56) References Cited

U.S. PATENT DOCUMENTS 7,138,316 B2 * 11/2006 Jin et al. ................ 438/269
2006/0046392 A1 3/2006 Manning et al.
2007/0059894 A1 3/2007 Chakravarti et al.
2007/0160760 A1 * 7/2007 Shin et al. ............... 427/255.35
2008/0188053 A1 * 8/2008 Ting et al. ................ 438/382

OTHER PUBLICATIONS

U.S. Appl. No. 11/970,592, filed Jan. 8, 2008, Notice of Allowance dated Nov. 17, 2009.
U.S. Appl. No. 11/970,592, filed Jan. 8, 2008, Response to Office Action, filed Oct. 13, 2009.
U.S. Appl. No. 11/970,592, filed Jan. 8, 2008, Office Action dated Jul. 14, 2009.
U.S. Appl. No. 11/970,592, filed Jan. 8, 2008, Response to Restriction Requirement filed Apr. 24, 2009.
U.S. Appl. No. 11/970,592, filed Jan. 8, 2008, Requirement for Restriction/Election dated Apr. 21, 2009.

* cited by examiner

*Primary Examiner* — Phuc Dang
(74) *Attorney, Agent, or Firm* — Yuanmin Cai; Hoffman Warnick LLC

(57) ABSTRACT

Solutions for fabricating a semiconductor structure. One embodiment includes a method for fabricating a semiconductor structure, the method including: forming a first dielectric structure on a substrate, the first dielectric structure including silicon nitride ($Si_3N_4$); forming a second dielectric structure in proximity to the first dielectric structure; and growing a non-epitaxial thin film from a surface of the first dielectric structure; wherein the growing includes using a combination of precursor, carrier and etchant with a ratio among the precursor, carrier, and etchant being adjusted for selective growth of the thin film on the surface, and wherein the thin film includes one selected from a group consisting of: a monocrystalline material, an amorphous material, a polycrystalline material and a combination thereof.

19 Claims, 8 Drawing Sheets

US 8,080,451 B2

FABRICATING SEMICONDUCTOR STRUCTURES

CROSS-REFERENCE TO RELATED APPLICATIONS

This application is a divisional of issued U.S. Pat. No. 7,687,804, application Ser. No. 11/970,592, filed Jan. 8, 2008. The application identified above is incorporated herein by reference in its entirety to provide continuity of disclosure.

BACKGROUND

1. Technical Field

The disclosure relates generally to selective non-epitaxial growth (SNEG) of non-epitaxial materials on a semiconductor substrate in the fabrication of complementary metal oxide semiconductor (CMOS), and more particularly, to methods of selectively forming amorphous and polycrystalline silicon on a non-crystalline surface of silicon nitride.

2. Background Art

In the current state of the art, selective epitaxial growth (SEG) of silicon on silicon surfaces is used in the fabrication of complimentary metal oxide semiconductor (CMOS). SEG may be performed in chemical vapor deposition (CVD) using a mixture of precursors and etchants in a carrier gas, for example, hydrogen ($H_2$). Typical precursors include: silane ($SiH_4$), dichlorosilane ($SiCl_2H_2$), germanes ($GeH_4$), dichlorogermane ($GeCl_2H_2$), etc.; and etchants typically include hydrochloride (HCL) and chlorine ($Cl_2$). The use of SEG provides a multitude of device fabrication options on different substrate materials. In addition, SEG of silicon (Si) or silicon germanium (SiGe) offers self-alignment, low costs, in-situ local doping for the fabrication of local device strain.

Despite the advantages, SEG does not provide non-epitaxial silicon growth on both crystalline and non-crystalline surfaces. This presents a limitation with respect to the growth of Si or SiGe on surfaces like oxides, nitrides or any other front-end-of the-line (FEOL) compliant material that are of high temperature and contaminant free.

SUMMARY

Solutions for fabricating a semiconductor structure are disclosed. One embodiment includes a method for fabricating a semiconductor structure, the method including: forming a first dielectric structure on a substrate, the first dielectric structure including silicon nitride ($Si_3N_4$); forming a second dielectric structure in proximity to the first dielectric structure; and growing a non-epitaxial thin film from a surface of the first dielectric structure; wherein the growing includes using a combination of precursor, carrier and etchant with a ratio among the precursor, carrier, and etchant being adjusted for selective growth of the thin film on the surface, and wherein the thin film includes one selected from a group consisting of: a monocrystalline material, an amorphous material, a polycrystalline material and a combination thereof.

A first aspect of the disclosure provides a method for fabricating a semiconductor structure. The method includes: forming a first dielectric structure on a substrate, the first dielectric structure including silicon nitride ($Si_3N_4$); forming a second dielectric structure in proximity to the first dielectric structure; and growing a non-epitaxial thin film from a surface of the first dielectric structure; wherein the growing includes using a combination of precursor, carrier and etchant with a ratio among the precursor, carrier, and etchant being adjusted for selective growth of the thin film on the surface, and wherein the thin film includes one selected from a group consisting of: a monocrystalline material, an amorphous material, a polycrystalline material and a combination thereof.

A second aspect of the disclosure provides a method for fabricating a semiconductor structure. The method includes forming a first dielectric structure including silicon nitride ($Si_3N_4$) on a substrate; forming a second dielectric structure in proximity to the first dielectric structure on the substrate; and growing a non-epitaxial thin film selectively from a surface of the first dielectric structure, wherein the growing includes using a combination of precursor, carrier and etchant with a ratio among the precursor, carrier, and etchant being adjusted for selective growth of the thin film on the surface, and wherein the thin film includes one selected from a group consisting of: a monocrystalline material, an amorphous material, a polycrystalline material and a combination thereof.

A third aspect of the disclosure provides a method for fabricating a semiconductor structure. The method includes forming a polygate layer over a substrate; forming a first dielectric structure including silicon nitride ($Si_3N_4$) on the polygate layer; forming a second dielectric structure in proximity to the first dielectric structure on the polygate layer; and growing a non-epitaxial thin film selectively from a surface of the first dielectric structure, wherein the growing includes using a combination of precursor, carrier and etchant with a ratio among the precursor, carrier, and etchant being adjusted for selective growth of the thin film on the surface, and wherein the thin film includes one selected from a group consisting of: a monocrystalline material, an amorphous material, a polycrystalline material and a combination thereof.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1A:
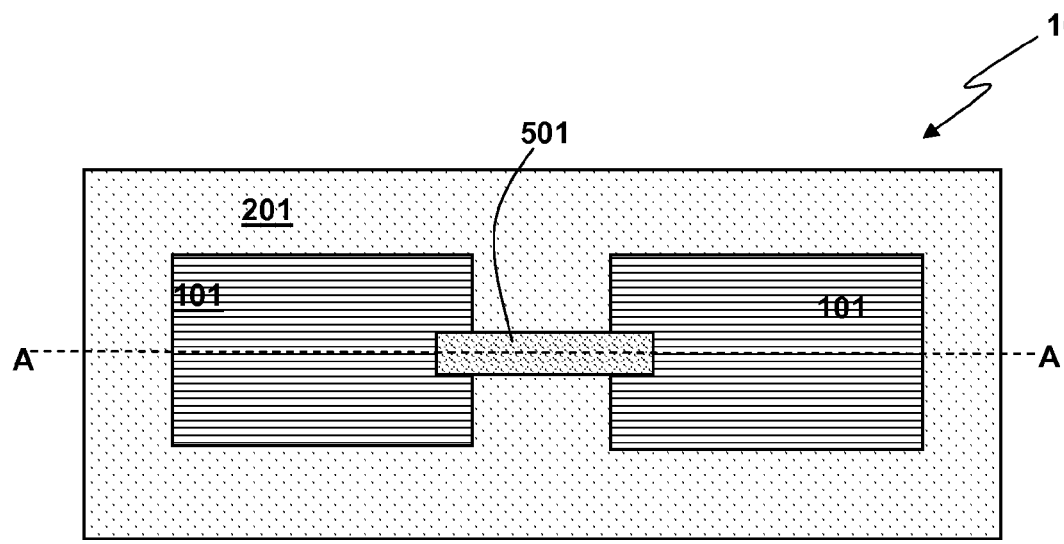
FIGS. 1-8 are cross-sectional views of various semiconductor structures fabricated according to the methods of the disclosure.

Embodiments depicted in the drawings in FIGS. 1-8 illustrate the resulting structures 10, 20, 30, 40, 50, 60, 70 and 80 according to methods of the different aspects of selective non-epitaxial growth (SNEG) of amorphous or polycrystalline materials on non-crystalline surfaces in semiconductor devices.

The amorphous or polycrystalline materials illustrated in each embodiment may be silicon (Si), silicon germanium (SiGe) or a combination thereof, hereinafter represented by "Si/SiGe". The materials may be doped with one or a combination of dopants, for example, but not limited to boron, arsenic, phosphorous, gallium (Ga), antimony (Sb) and carbon (C). The methods are implemented through the use of currently known or later developed reduced pressure chemical vapor deposition (RPCVD) reactors (not shown). The pressure applied in the RPCVD reactors may range from approximately 1 Torr to approximately 200 Torr to implement the methods of the current disclosure.

Carrier gases, for example, but not limited to hydrogen (H), argon (Ar) and nitrogen ($N_2$), are used with precursors, for example, but not limited to silane ($SiH_4$), dichlorosilane ($SiH_2Cl_2$), trichlorosilane ($SiHCl_3$), tetrachlorosilane ($SiCl_4$), disilane ($Si_2H_6$), trisilane ($Si_3H_8$), germylsilanes ($SiGeH_6$), germane ($GeH_4$), dichlorogermane ($GeH_2Cl_2$), trichlorogermane ($GeHCl_3$), tetrachlorogermane ($GeCl_4$) and silylgermanes. Etchants including, for example, but not limited to dichlorosilane ($SiH_2Cl_2$), hydrochloride (HCl) and chlorine ($Cl_2$), are introduced with careful adjustment to flow rate for selectivity purposes. Trace amounts of an etchant, for example, hydrochloride (HCl) is first mixed into precursor-carrier mixture (e.g., $SiH_4$—$H_2$ or $GeH_4$—$H_2$). The flow of HCl into the reactor is varied from approximately 20 standard cubic centimeters per minute (sccm) to approximately 60 sccm such that a precursors-carrier-etchant gas mixture of, for example, $SiH_4$, GeH4, $H_2$ and HCL is formed to provide for non-epitaxial growth of amorphous/polycrystalline Si or SiGe on a non-crystalline material. To achieve selectivity in the non-epitaxial growth (SNEG) of amorphous/polycrystalline materials, precursors-carrier-etchant ratio may be varied. A mixture of precursor-carrier-etchant of $SiH_4$—$GeH_4$—$H_2$—HCl may have a ratio, based on volumetric flow rate, ranging from for example, but not limited to, approximately 1:0.5:30:0.2 to approximately 1:0.5:30:0.7. In other words, the ratio for HCl in the mixture may range from approximately 0.2 to approximately 0.7. In an exemplary embodiment, the above ratio of precursor-carrier-etchant is preferably 1:0.5:30:0.5. The pressure of the gas mixture may be increased with adjustment to the partial pressure of the precursor constituent. Through adjusting of temperature, pressure, flow-rate of etchant and precursors-carrier-etchant ratios, specific selectivity of deposition of amorphous/polycrystalline Si/SiGe on non-crystalline materials may be achieved within a small window. At the same time, where a monocrystalline, hereinafter "crystalline", silicon surface is exposed, epitaxial growth on the crystalline silicon surface may be controlled in the same environment within the small window. Ranges of the small window vary according to the desired architecture or need of each semiconductor structure for fabricating a device therefrom.

The small window may be achieved by varying the flow of etching constituent in the gas mixture to selectivity threshold levels above that for silicon oxide ($SiO_2$), hereinafter "oxide", and below that for silicon nitride ($Si_3N_4$), hereinafter "nitride", where SNEG of amorphous/polycrystalline Si/SiGe on nitride may be achieved. In the case where a target surface does not include exposed crystalline silicon, a doped or undoped SNEG of non-epitaxial Si/SiGe can be grown thereon. Typically, a nitride or oxide layer may be formed on a substrate to cover the exposed crystalline Si surface of the substrate. In the case where the target surface includes exposed crystalline silicon, epitaxial growth of Si/SiGe may occur thereon. When desired, epitaxial and non-epitaxial Si/SiGe may be grown forming integrated sections of monocrystalline/amorphous/polycrystalline Si/SiGe in a semiconductor structure. Such integrated sections have epitaxial Si/SiGe, grown on exposed crystalline Si, contact non-epitaxial (i.e., amorphous/polycrystalline) Si/SiGe, grown on non-crystalline materials. For example, the non-epitaxial Si/SiGe may be grown on a nitride which covers the exposed crystalline silicon substrate. In the case where the non-crystalline material is oxide, epitaxial and non-epitaxial growth of Si/SiGe does not occur thereon. For example, a crystalline substrate may be covered by an oxide layer and/or a nitride layer at certain separately selected portions and left exposed at certain portions of the substrate surface. At portions where the substrate surface is covered with nitride, non-epitaxial Si/SiGe may grow thereon. At portions where the crystalline substrate surface is covered with oxide no growth will occur, (i.e., both epitaxial and non-epitaxial Si/SiGe growth do not occur). At portions where the crystalline substrate surface is exposed (i.e., not covered by nitride or oxide), epitaxial growth of crystalline Si/SiGe will occur. The use of nitride and oxide in the currently disclosed SNEG methods, provides control over the design of a semiconductor structure through the combination of selective epitaxial growth and selective non-epitaxial growth of Si/SiGe on a substrate. Such control provides for numerous possible fabrication processes that may be incorporated into existing fabrication schemes. The following paragraphs discuss, in various examples, the possible type semiconductor structures that can be fabricated with the disclosed SNEG methods.

Figure 1B:
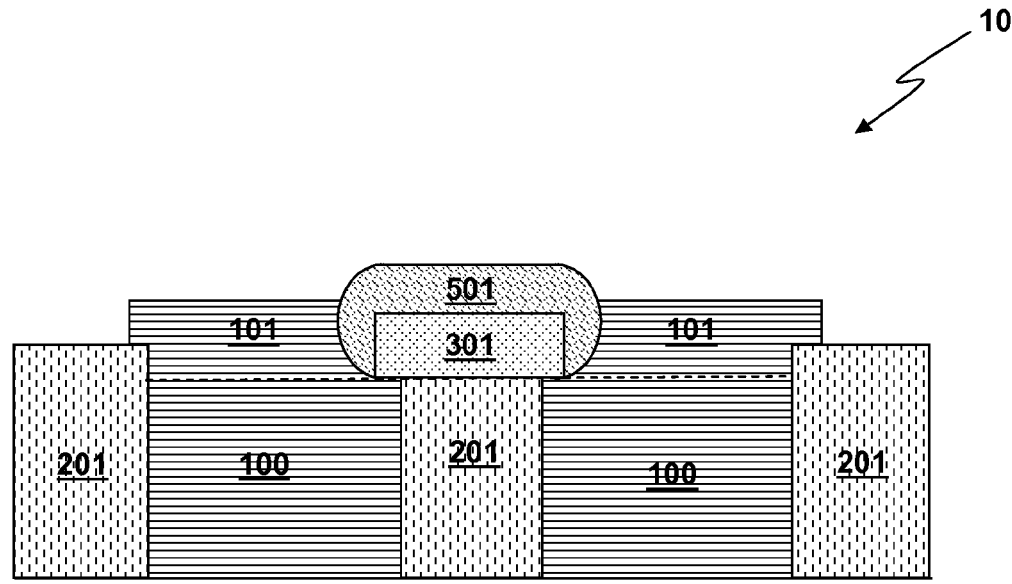

FIGS. 1A-1B illustrate an embodiment of a semiconductor structure 10 depicting a front-end-of-the-line (FEOL) resistor formed by incorporating the disclosed SNEG methods detailed in the foregoing paragraphs. FIG. 1A illustrates a top view of semiconductor structure 10, with epitaxially grown crystalline Si/SiGe regions 101 bridged by a non-epitaxially grown poly crystalline or amorphous Si/SiGe region 501. FIG. 1B is a cross-sectional view taken along the line A-A in FIG. 1A and illustrates semiconductor structure 10 with silicon substrate 100 incorporating shallow trench isolations (STI) 201 formed by currently known or later developed fabrication techniques using silicon oxide. Disposed on substrate 100 is a silicon nitride layer 301 formed by currently known or later developed techniques. By applying the disclosed SNEG method, a non-epitaxial Si/SiGe layer 501 grows from the surface of silicon nitride layer 301. Under the settings of the disclosed SNEG method, epitaxial growth of crystalline Si/SiGe occurs on the surface of crystalline silicon substrate 100. Non-epitaxial Si/SiGe layer 501 constitutes amorphous/polycrystalline Si/SiGe while epitaxial crystalline Si/SiGe layer 101 constitutes monocrystalline Si/SiGe of a single crystalline orientation. Non-epitaxial amorphous/polycrystalline Si/SiGe layer 501 is grown from the surface of silicon nitride layer 301 in a lateral and bottom-up manner while epitaxial crystalline Si/SiGe layer 101 is grown from crystalline silicon substrate 100 in a bottom-up manner. The growth of non-epitaxial amorphous/polycrystalline Si/SiGe and epitaxial crystalline Si/SiGe is achieved within a small window by adjusting growth selectivity according crystalline silicon and silicon nitride according to the disclosed SNEG methods. The precursors-carrier-etchant ratio of $SiH_4$-GeH4-$H_2$—HCL gas mixture for the formation of non-epitaxial Si/SiGe layer 501 and epitaxial crystalline Si/SiGe layer 101 in this embodiment may range from approximately 1:0.5:30:0.2 to approximately 1:0.5:30:0.7, but preferably approximately 1:0.5:30:0.5. With a combination of non-epitaxial Si/SiGe layer 501 and epitaxial layer 101 incorporated in semiconductor structure 10, resistance of the semiconductor structure 10 can be tuned by adjusting the thickness of non-epitaixal Si/SiGe layer 501 and percentage composition of dopants, silicon (Si), silicon-germanium (SiGe) therein. The tuning can be achieved through currently known or later developed methods of adjusting the type and amount of dopants, the precursors-carrier-etchant ratios, the flow rate of etchant, the partial pressures applied to precursors and etchants.

Figure 2A:
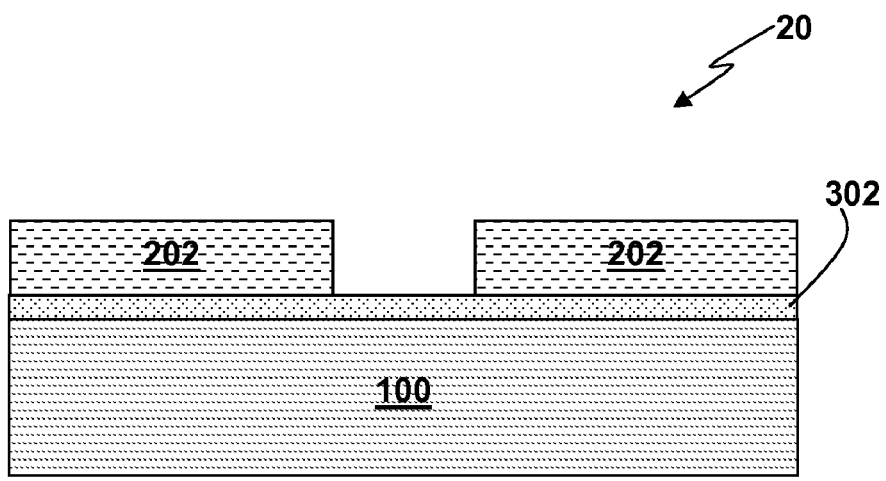
Figure 2B:
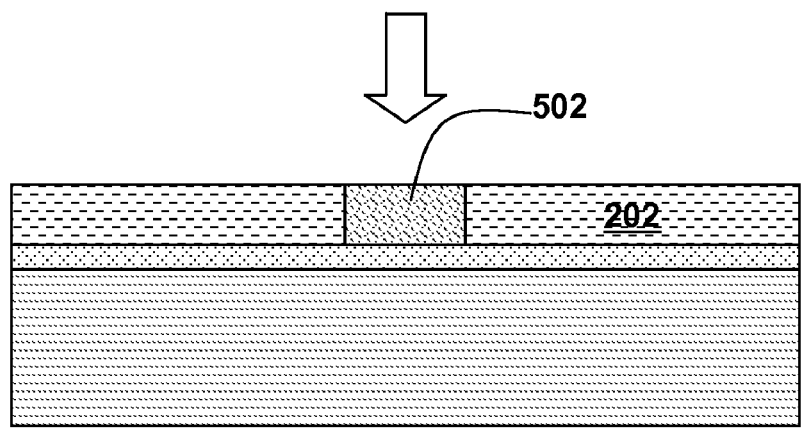
Figure 2C:
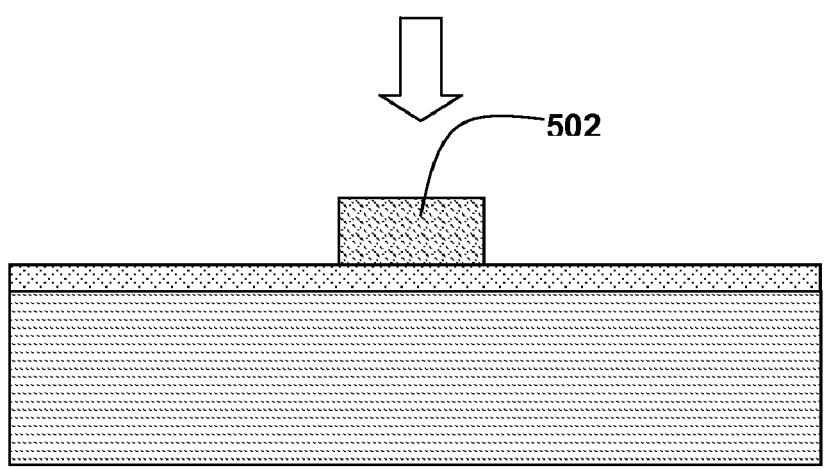

FIGS. 2A-2C illustrate a semiconductor structure 20 using SNEG of doped or undoped Si/SiGe to create a hard mask in a fabrication process. FIG. 2A illustrates a silicon nitride ($Si_3N_4$) layer 302, disposed on a substrate 100, on which a silicon oxide layer 202 is disposed. The silicon oxide layer 202 incorporates a non-epitaxial Si/SiGe region 502 as illustrated in FIG. 2B. Non-epitaxial Si/SiGe region 502 is grown on silicon nitride ($Si_3N_4$) layer 302 in a bottom-up manner according to the disclosed SNEG methods. FIG. 2C illustrates the semiconductor structure 20 after oxide layer 202 is stripped using currently known or later developed techniques including, for example, but not limited to etching with aqueous hydrogen fluoride (HF). The resulting semiconductor structure in FIG. 2C includes non-epitaxial Si/SiGe region 502 on $Si_3N_4$ layer 302.

Figure 3A:
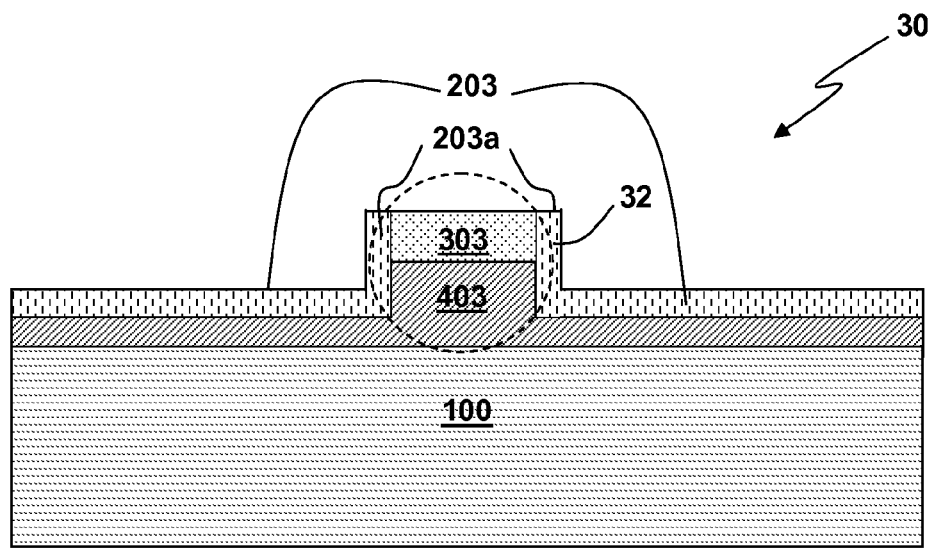
Figure 3B:
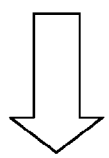
Figure 3B:
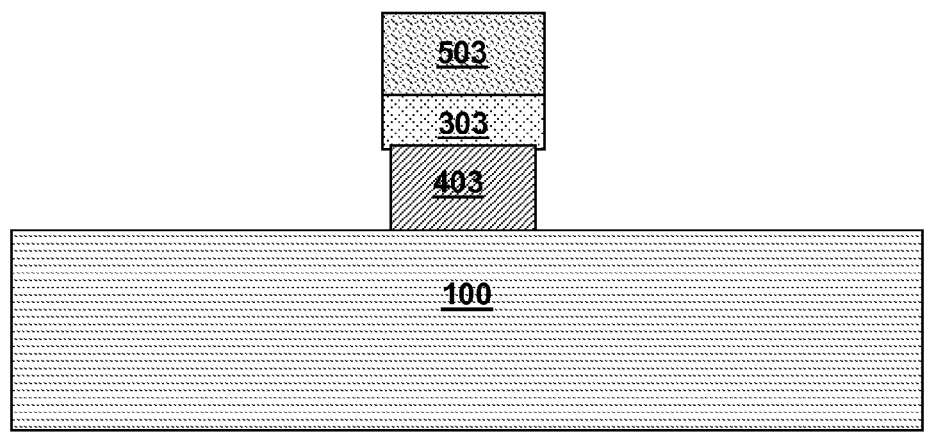

FIGS. 3A-3B illustrate another semiconductor structure 30 using SNEG of doped or undoped Si/SiGe to strengthen a hard mask in a semiconductor fabrication process. Semiconductor structure 30 includes a substrate 100 with polygate layer 403 grown thereon by currently known or later developed techniques. Polygate layer 403 may include, for example, but is not limited to oxide, monocrystalline silicon, polysilicon, metal silicide and metal. Silicon nitride layer 303 is formed on polygate layer 403 using currently know or later developed techniques. Polygate layer 403 and silicon nitride layer 303 form a section 32 of increased thickness where a silicon oxide layer 203, deposited by currently known or later developed techniques, forms a sidewall portion 203a. According to disclosed SNEG method, a non-epitaxial Si/SiGe region 503 (FIG. 3B) is grown from the surface of silicon nitride layer 303 in a bottom-up manner. This is achieved by reducing hydrochloride (HCl) etchant to below the selectivity threshold level for silicon nitride 303 and above selectivity threshold level for silicon oxide 203/203a. FIG. 3B illustrates semiconductor structure 30 after silicon oxide layer 203 is removed and reactive ion etch (RIE) of polygate layer 403 has been completed.

Figure 4A:
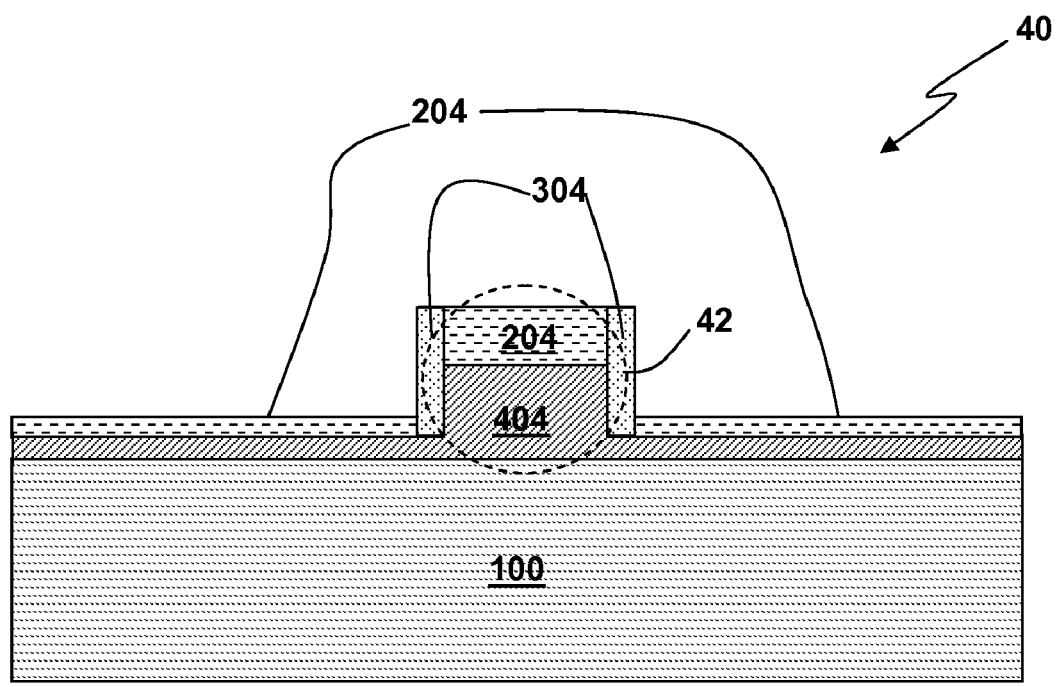
Figure 4B:
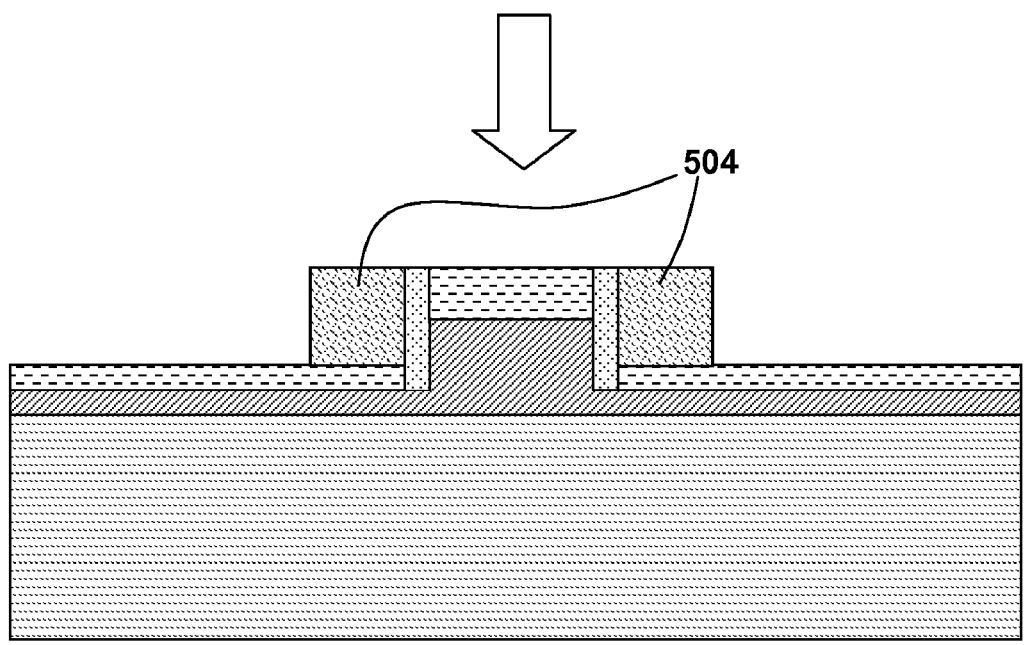

FIGS. 4A-4B illustrate another embodiment of a semiconductor structure 40 formed using of the disclosed SNEG methods for spacer widening. FIG. 4A shows a substrate 100 with a polygate layer 404 disposed thereon. Polygate layer 404 may include, for example, but is not limited to monocrystalline silicon, polycrystalline silicon, silicon oxide, silicon nitride, metal silicide and metal, is grown by currently know or later developed fabrication techniques on crystalline silicon substrate 100. Silicon oxide 204 is disposed on polygate layer 404 by currently known or later developed techniques. Polygate layer 404 and silicon oxide 204 form an elevated section 42 about which is formed silicon nitride sidewalls 304. With the disclosed SNEG method, non-epitaxial Si/SiGe region 504 is grown laterally from silicon nitride sidewalls 304, as illustrated in FIG. 4B. Non-epitaxial Si/SiGe region 504 extends laterally from the surfaces of silicon nitride sidewalls 304 in a horizontal manner above the oxide layer 200.

Figure 5A:
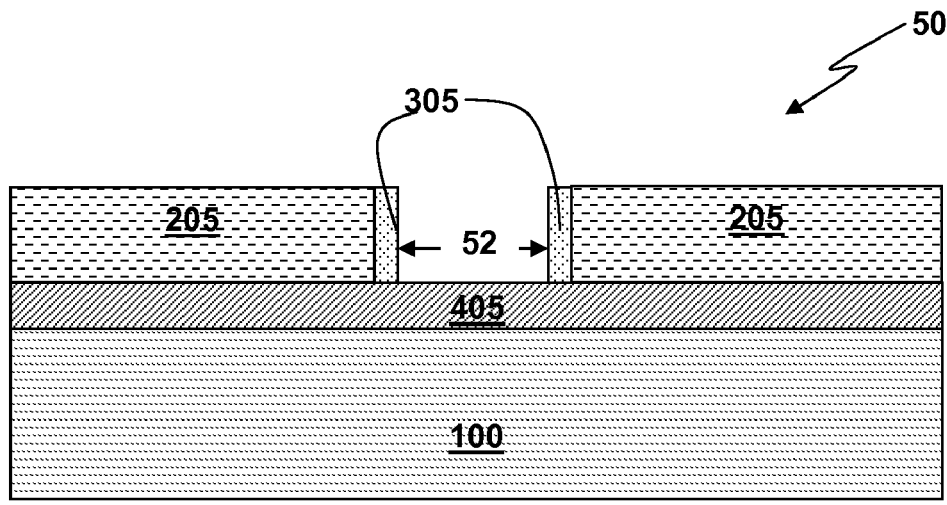
Figure 5B:
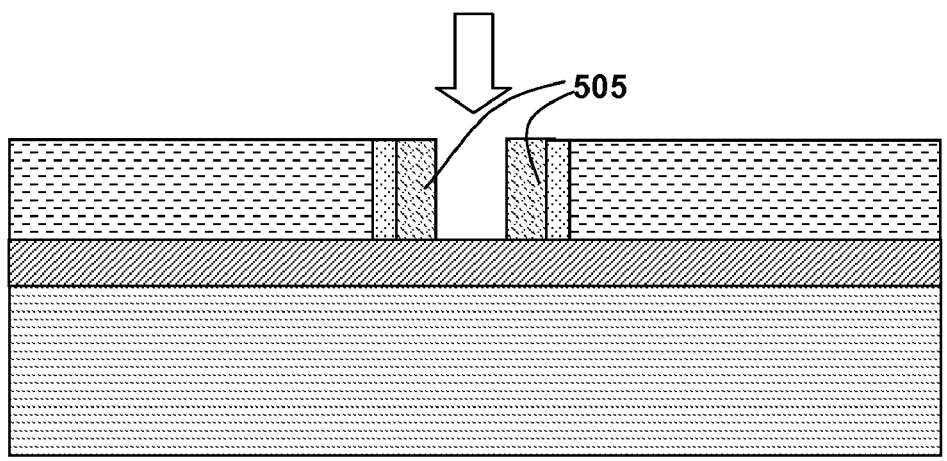
Figure 5C:
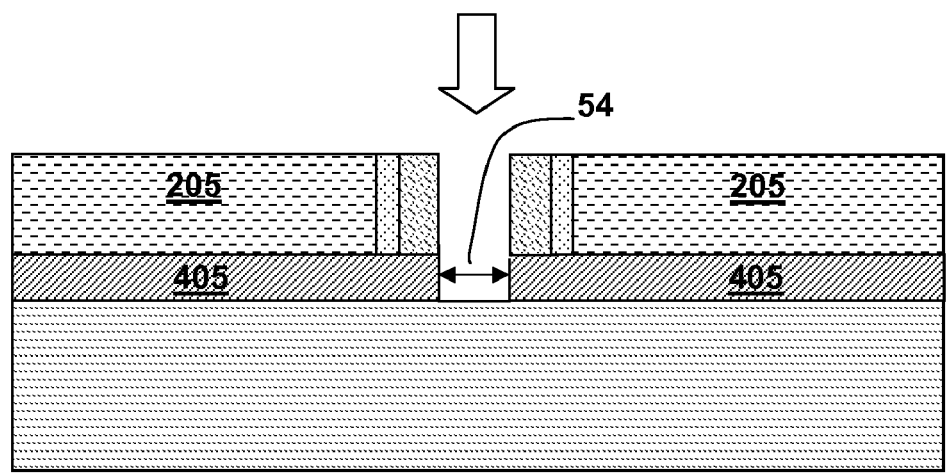

FIGS. 5A-5B illustrate an embodiment of a semiconductor structure 50 formed by incorporating the disclosed SNEG method in critical dimension (CD) tailoring processes. As shown in FIG. 5A, polygate layer 405 is disposed on silicon substrate 100. A silicon oxide layer 205, formed by currently known or later developed techniques, is disposed on polygate layer 405 and patterned using currently known or later developed methods. Patterned silicon oxide layer 205 includes vertical sidewalls 305 of silicon nitride ($Si_3N_4$) formed therein by currently known or later developed fabrication techniques. FIG. 5B illustrates a non-epitaixal Si/SiGe region 505 grown according to disclosed SNEG methods, from the surface of $Si_3N_4$ sidewalls 305 in a horizontal manner. Non-epitaixal Si/SiGe region 505 increases to the thickness of the $Si_3N_4$ sidewalls 305 in the patterned silicon oxide layer 205. With the increased thickness, initial critical dimension 52 (FIG. 5A) is reduced to final critical dimension 54 (FIG. 5C). Further processing results in a structure as illustrated in FIG. 5C where polygate layer 405 is etched according to patterned silicon oxide layer 205 with reduced critical dimension 54. The thickness of the non-epitaxial Si/SiGe region 505 may be varied in a feed-forward manner for correcting pattern dimensions that are initially off-target.

Figure 6A:
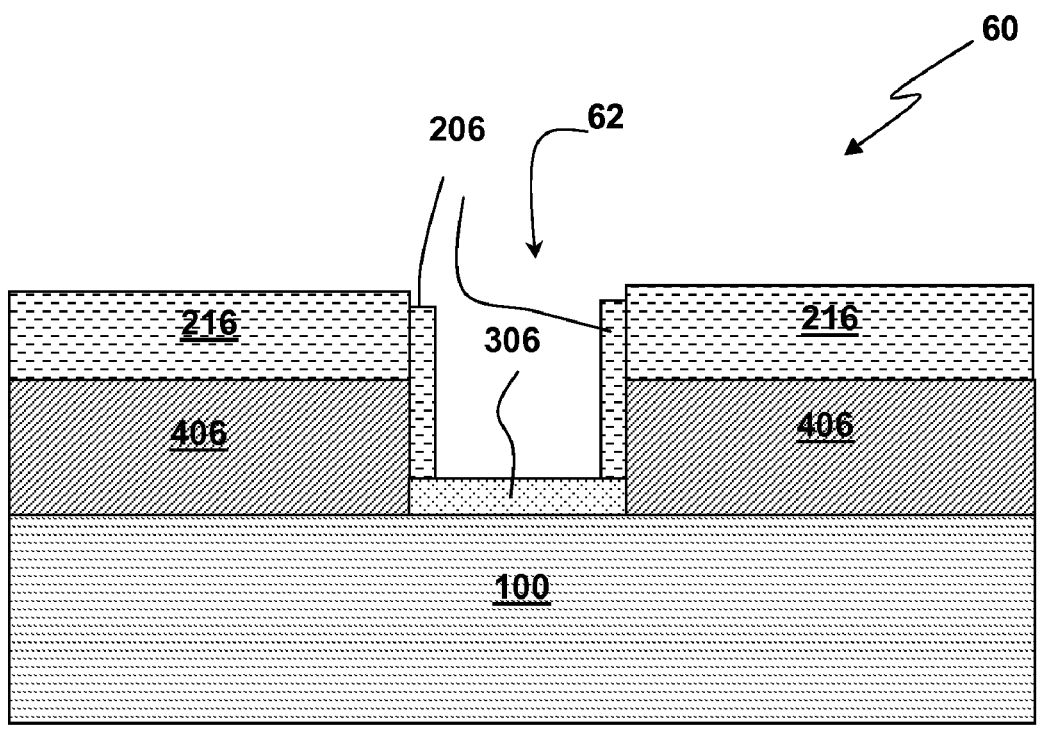
Figure 6B:
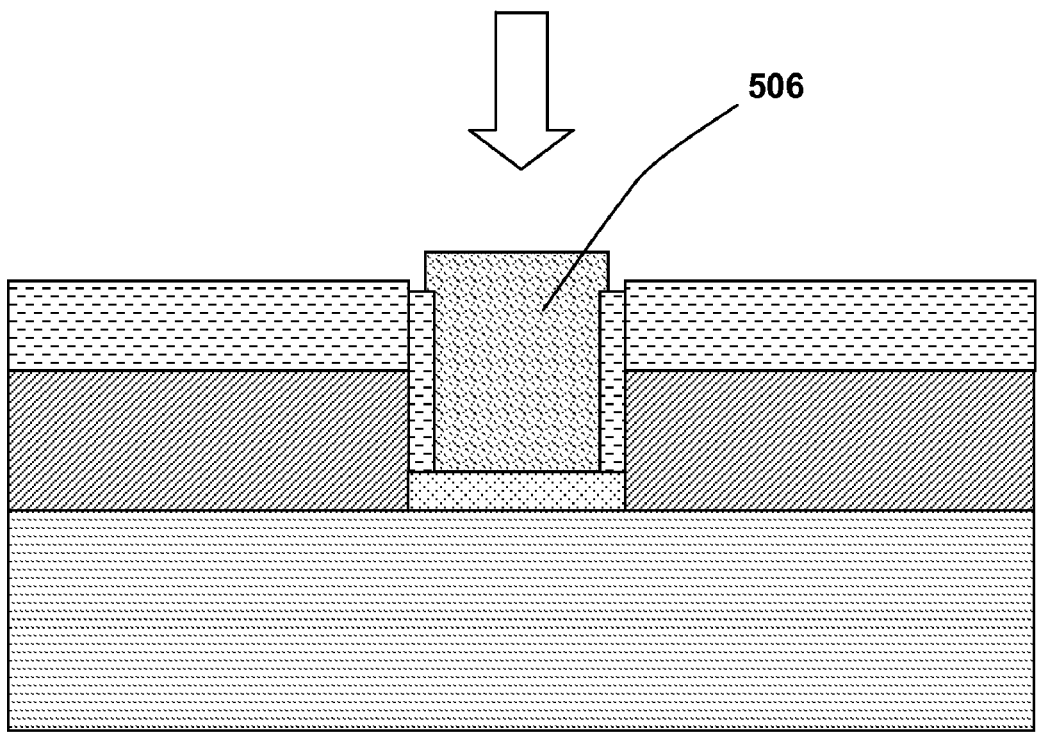

FIGS. 6A-6B illustrate an embodiment of a semiconductor structure 60 resulting from implementation of the disclosed SNEG methods for filling a high aspect ratio (HAR) via cavity 62. FIG. 6A shows a similar structure as FIG. 5A, except that silicon oxide region 205 (FIG. 5A) is replaced by silicon nitride region 306 (FIG. 6A); and silicon nitride sidewalls 305 (FIG. 5A) are replaced by silicon oxide sidewalls 206 (FIG. 6A). In an alternative embodiment (not shown), silicon nitride region 306 is removed exposing silicon substrate 100 and silicon nitride sidewalls 306 extend upwards from surface of substrate 100. As in FIG. 5A, semiconductor structure 60 illustrated in FIG. 6A also shows a silicon oxide layer 216 disposed on polygate regions 406 formed by currently known or later developed fabrication techniques of CMOS processes. Silicon oxide sidewalls 206 and silicon nitride region 306 define a HAR via cavity 62, which is filled by a non-epitaxial Si/SiGe region 506 (FIG. 6B). Non-epitaxial Si/SiGe region 506 is grown from silicon nitride region 306 in a bottom-up manner through the methods of SNEG of amorphous/polycrystalline Si/SiGe as disclosed in the above paragraphs.

Figure 7A:
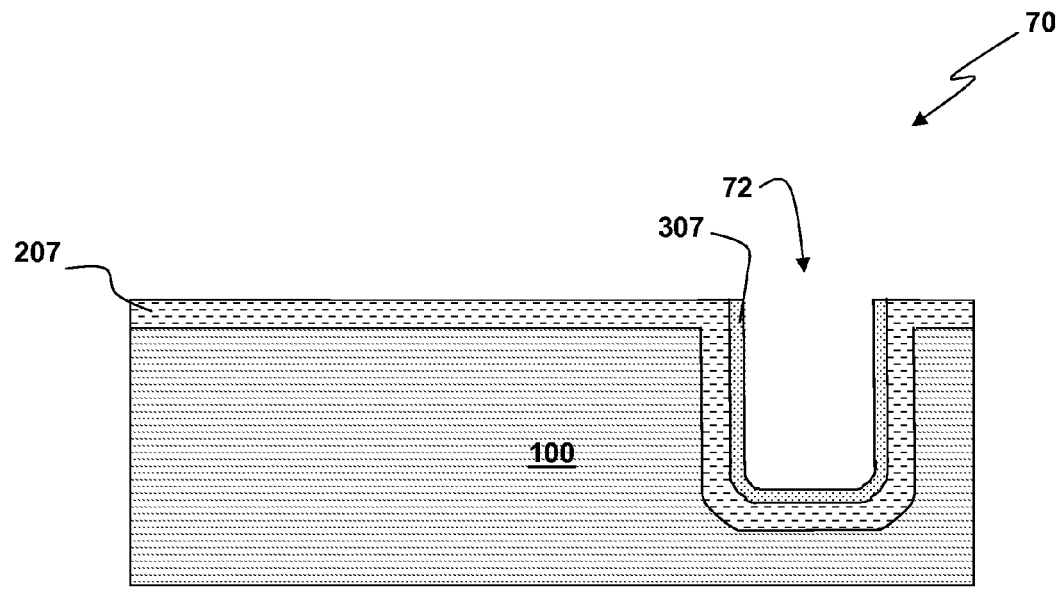
Figure 7B:
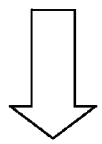
Figure 7B:
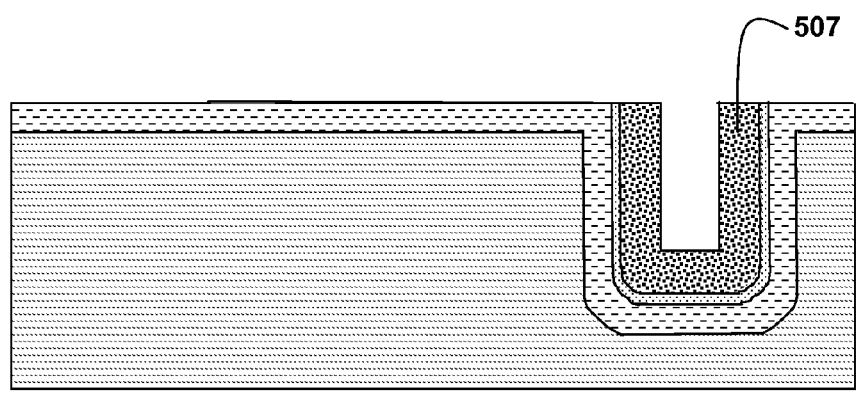

FIG. 7A-FIG. 7B illustrate yet another embodiment of a semiconductor structure 70 formed by a fabrication process incorporating the disclosed SNEG method. FIG. 7A shows a trench 72 in substrate 100 formed by currently known or later developed techniques in CMOS fabrication processes. Trench 72 may be a shallow trench isolation (STI) or a deep trench isolation. Disposed on substrate 100 is silicon oxide layer 207 lining trench 72. A silicon nitride lining 307 is disposed over silicon oxide 207 in trench 72. FIG. 7B shows a non-epitaxial Si/SiGe lining 507 disposed on silicon nitride lining 307. Non-epitaxial Si/SiGe lining 507 is formed according to disclosed SNEG method with selectivity threshold level adjusted for growth on silicon nitride.

Figure 8:
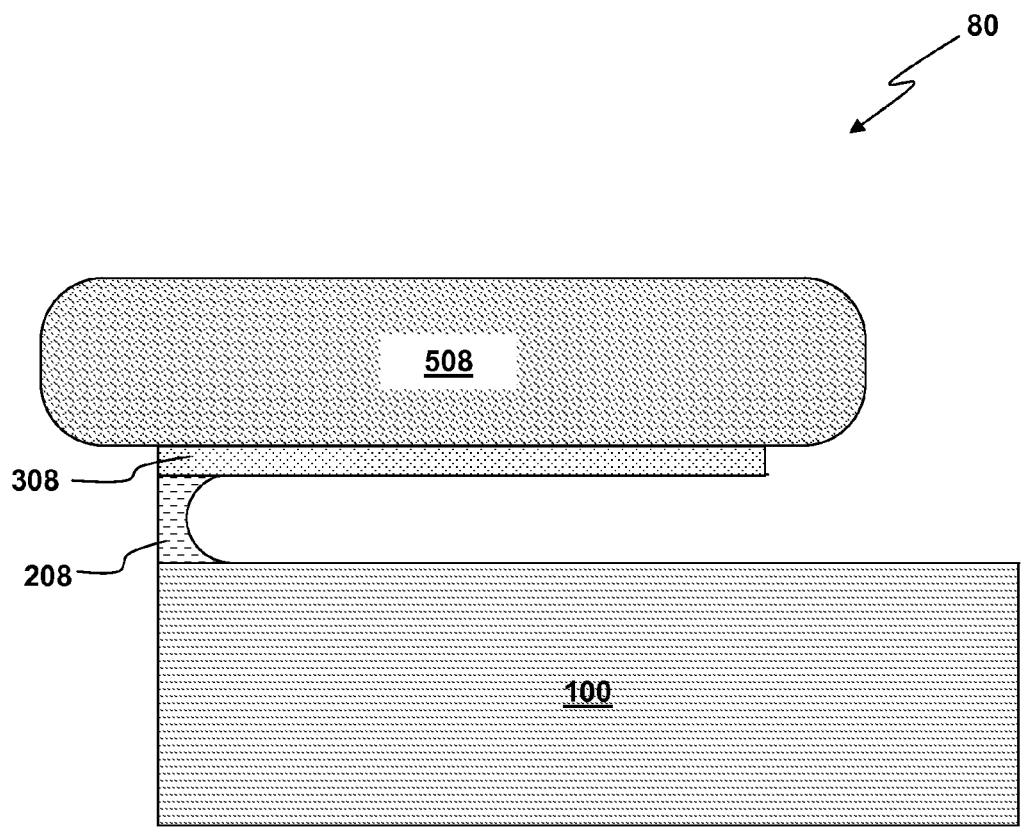

FIG. 8 illustrates a semiconductor structure 80 formed using disclosed SNEG methods in the fabrication of a micro-electro-mechanical system (MEMS). Semiconductor structure 80 includes a substrate 100 of crystalline material on which a silicon oxide layer 208 is disposed. On silicon oxide layer 208 is disposed silicon nitride layer 308. Non-epitaxial Si/SiGe layer 508 is formed, according to disclosed SNEG methods, over silicon nitride layer 308. Following SNEG of non-epitaxial Si/SiGe layer 508, silicon oxide layer 208 is over etched by currently known or later developed techniques, for example, by aqueous hydrogenflouride (HF), to achieve semiconductor structure 80 as shown (FIG. 8).

The foregoing description of various aspects of the disclosure has been presented for purposes of illustration and description. It is not intended to be exhaustive or to limit the scope of the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for fabricating a semiconductor structure, the method comprising:
   forming a first dielectric structure on a substrate, the first dielectric structure including silicon nitride ($Si_3N_4$);
   forming a second dielectric structure in proximity to the first dielectric structure; and
   growing a non-epitaxial thin film from a surface of the first dielectric structure;
   wherein the growing includes using a combination of precursor, carrier and etchant with a ratio among the precursor, carrier, and etchant being adjusted for selective growth of the thin film on the surface, and wherein the thin film includes one selected from a group consisting of: a monocrystalline material, an amorphous material, a polycrystalline material and a combination thereof.

2. The method according to claim 1, wherein the precursor includes at least a first precursor and a second precursor, and a ratio among the first precursor, the second precursor, the carrier, and the etchant equals approximately to 1:0.5:30:N, in volumetric flow rate, with N ranging from approximately 0.2 to approximately 0.7.

3. The method according to claim 1, wherein the precursor includes silane ($SiH4$), germane ($GeH4$), dichlorosilane ($SiH2Cl2$), dichlorogermane ($GeH2Cl2$), and wherein the etchant includes hydrochloride (HCl) and chlorine (Cl2).

4. The method according to claim 1, wherein the etchant is varied to selectivity threshold levels above that for oxide and below that for nitride.

5. The method according to claim 1, wherein the etchant is reduced by varying an overall pressure and partial pressures of the precursor and etchant mixture.

6. The method according to claim 1, wherein the pressure of the mixture of precursor, carrier and etchant varies from a range of approximately 1 Torr to approximately 200 Torr.

7. The method according to claim 1, wherein the amount of etchant is adjusted by varying a flow rate ranging from approximately 20 sccm to approximately 60 sccm.

8. The method according to claim 1, wherein the growing of the thin film extends vertically from the surface in a bottom-up manner.

9. The method according to claim 1, wherein the growing of the thin film extends laterally from the surface in a horizontal manner.

10. The method according to claim 1, wherein the second dielectric structure includes silicon dioxide ($SiO2$).

11. A method for fabricating a semiconductor structure, the method comprising:
    forming a first dielectric structure including silicon nitride ($Si_3N_4$) on a substrate;
    forming a second dielectric structure in proximity to the first dielectric structure on the substrate; and
    growing a non-epitaxial thin film selectively from a surface of the first dielectric structure,
    wherein the growing includes using a combination of precursor, carrier and etchant with a ratio among the precursor, carrier, and etchant being adjusted for selective growth of the thin film on the surface, and wherein the thin film includes one selected from a group consisting of: a monocrystalline material, an amorphous material, a polycrystalline material and a combination thereof.

12. The method according to claim 11, wherein the precursor includes silane ($SiH4$), germane ($GeH4$), dichlorosilane ($SiH2Cl2$), dichlorogermane ($GeH2Cl2$), and wherein the etchant includes hydrochloride (HCl) and chlorine (Cl2).

13. The method according to claim 11, wherein the non-epitaxial thin film is one selected from a group consisting of: silicon (Si), silicon-germanium, doped silicon, doped silicon germanium and a combination thereof.

14. The method according to claim 11, wherein the second dielectric structure includes silicon oxide ($SiO2$).

15. The method according to claim 11, wherein the substrate is selected from a group consisting of: crystalline silicon, crystalline silicon germanium, doped crystalline silicon, doped crystalline silicon germanium and a combination thereof.

16. A method for fabricating a semiconductor structure, the method comprising:
    forming a polygate layer over a substrate;
    forming a first dielectric structure including silicon nitride ($Si_3N_4$) on the polygate layer;
    forming a second dielectric structure in proximity to the first dielectric structure on the polygate layer; and
    growing a non-epitaxial thin film selectively from a surface of the first dielectric structure,
    wherein the growing includes using a combination of precursor, carrier and etchant with a ratio among the precursor, carrier, and etchant being adjusted for selective growth of the thin film on the surface, and wherein the thin film includes one selected from a group consisting of: a monocrystalline material, an amorphous material, a polycrystalline material and a combination thereof.

17. The method according to claim 16, wherein the precursor includes silane ($SiH4$), germane ($GeH4$), dichlorosilane ($SiH2Cl2$), dichlorogermane ($GeH2Cl2$), and wherein the etchant includes hydrochloride (HCl) and chlorine (Cl2).

18. The method according to claim 16, wherein the non-epitaxial thin film is one selected from a group consisting of: silicon (Si), silicon-germanium, doped silicon, doped silicon germanium and a combination thereof.

19. The method according to claim 16, wherein the second dielectric structure includes silicon oxide ($SiO2$).

* * * * *